US011054756B2

(12) United States Patent
Lin et al.

(10) Patent No.: US 11,054,756 B2
(45) Date of Patent: *Jul. 6, 2021

(54) APPARATUS AND METHOD FOR CLEANING RETICLE STAGE

(71) Applicant: TAIWAN SEMICONDUCTOR MANUFACTURING CO., LTD., Hsinchu (TW)

(72) Inventors: Yu-Fu Lin, Hsinchu (TW); Tung-Jung Chang, Hsinchu County (TW); Chia-Chen Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/902,087

(22) Filed: Jun. 15, 2020

(65) Prior Publication Data

US 2020/0310258 A1    Oct. 1, 2020

Related U.S. Application Data

(63) Continuation of application No. 15/902,528, filed on Feb. 22, 2018, now Pat. No. 10,684,559.

(Continued)

(51) Int. Cl.
*G03B 27/42*  (2006.01)
*G03F 7/20*  (2006.01)
(Continued)

(52) U.S. Cl.
CPC ............ *G03F 7/70925* (2013.01); *B08B 3/12* (2013.01); *B08B 7/028* (2013.01); *G03F 7/709* (2013.01);
(Continued)

(58) Field of Classification Search
CPC ............ G03F 7/70925; G03F 7/70708; G03F 7/70341; G03F 7/70916; G03F 7/707;
(Continued)

(56) References Cited

U.S. PATENT DOCUMENTS 9,885,952 B2    2/2018  Shen et al.
10,459,353 B2   10/2019 Chien et al.
(Continued)

FOREIGN PATENT DOCUMENTS

CN    104049469 A    9/2014
CN    106391542 A    2/2017
(Continued)

OTHER PUBLICATIONS

Non-Final Office Action issued in U.S. Appl. No. 15/902,528, dated Aug. 19, 2019.
(Continued)

*Primary Examiner* — Mesfin T Asfaw
(74) *Attorney, Agent, or Firm* — McDermott Will & Emery LLP

(57) ABSTRACT

An apparatus for cleaning an electrostatic reticle holder used in a lithography system includes a chamber for providing a low pressure environment for the electrostatic reticle holder and an ultrasound transducer configured to apply ultrasound waves to the electrostatic reticle holder. The apparatus further includes a controller configured to control the ultrasound transducer and a gas flow controller. The gas flow controller is configured to enable pressurizing or depressurizing the chamber.

20 Claims, 10 Drawing Sheets

Related U.S. Application Data

(60) Provisional application No. 62/588,768, filed on Nov. 20, 2017.

(51) Int. Cl.
  *B08B 3/12* (2006.01)
  *B08B 7/02* (2006.01)

(52) U.S. Cl.
  CPC ........ *G03F 7/7085* (2013.01); *G03F 7/70708* (2013.01); *G03F 7/70858* (2013.01)

(58) Field of Classification Search
  CPC .......... G03F 1/84; G03F 7/70033; G03F 1/64; G03F 7/70933; G03F 7/70908; G03F 7/70716; G03F 7/70875; G03F 7/70741; G03F 7/70866; G03F 7/7085; G03F 7/20; G03F 7/70783; G03F 7/70858; G03F 7/709; H05G 2/006; H05G 2/003; B82Y 10/00; B22F 7/062; G03B 27/52; B08B 7/028; B08B 3/12
  See application file for complete search history.

(56) References Cited

U.S. PATENT DOCUMENTS

| | | |
|---|---|---|
| 2004/0090605 A1 | 5/2004 | Yogev |
| 2011/0069288 A1 | 3/2011 | Yamamoto |
| 2015/0103325 A1 | 4/2015 | Van Der Wilk et al. |
| 2015/0323862 A1 | 11/2015 | Chang et al. |
| 2016/0187302 A1 | 6/2016 | Satoh |

FOREIGN PATENT DOCUMENTS

| | | |
|---|---|---|
| CN | 107078081 A | 8/2017 |
| EP | 1341042 A2 | 9/2003 |
| EP | 1978545 A1 | 10/2008 |
| WO | 2016/142370 A1 | 9/2016 |

OTHER PUBLICATIONS

Notice of Allowance issued in U.S. Appl. No. 15/902,528, dated Feb. 13, 2020.

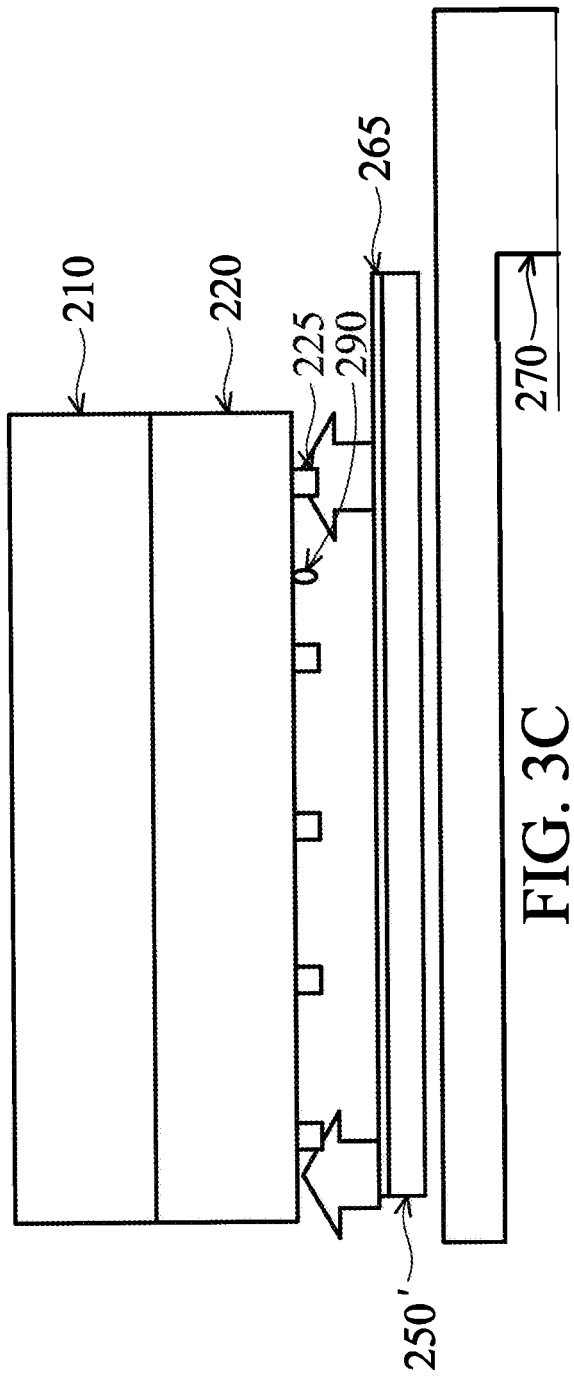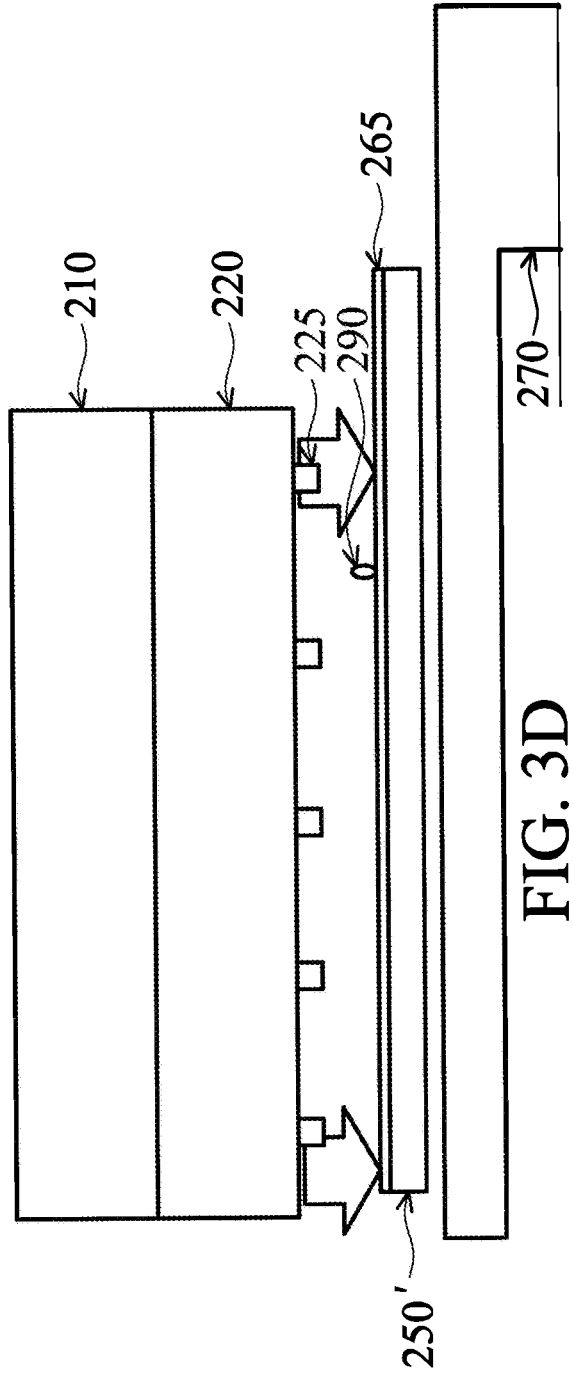

APPARATUS AND METHOD FOR CLEANING RETICLE STAGE

CROSS REFERENCE TO RELATED APPLICATIONS

This application is a continuation application of U.S. patent application Ser. No. 15/902,528 filed Feb. 22, 2018, now U.S. Pat. No. 10,684,559, which claims priority to U.S. Provisional Patent Application No. 62/588,768, filed Nov. 20, 2017, the entire contents of which are incorporated herein by reference.

TECHNICAL FIELD

This disclosure relates to methods and apparatus for lithography, particularly to cleaning a reticle holder used in a lithography tool.

BACKGROUND

Functional density, i.e., number of interconnected devices per chip, of semiconductor integrated circuits (ICs) has increased over the years. This increase in functional density has been achieved by reducing the size of individual devices on the chip. Semiconductor manufacturing techniques such as photolithography needed to continue this decreasing trend in size of devices is met by decreasing the wavelength of light used in photolithography.

For example, the wavelength of radiation used for photolithography has decreased from ultraviolet to deep ultraviolet (DUV) and, more recently to extreme ultraviolet (EUV). Further decreases in component size require further improvements in resolution of photolithography which are achievable using extreme ultraviolet lithography (EUVL). EUVL employs radiation having a wavelength of about 1-100 nm.

Because radiation in the EUV range is ionizing radiation, EUVL is generally performed in low-pressure or vacuum-like conditions. In such conditions, suction-based mask holders generally used for DUV photolithography do not work. An electrostatic reticle holder is, therefore, used for securing the mask or reticle used for EUVL.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3C and 3D schematically illustrates removal of particulate contaminants using an adhesive film relating to an embodiment of the present disclosure.

DETAILED DESCRIPTION

Figure 1A:
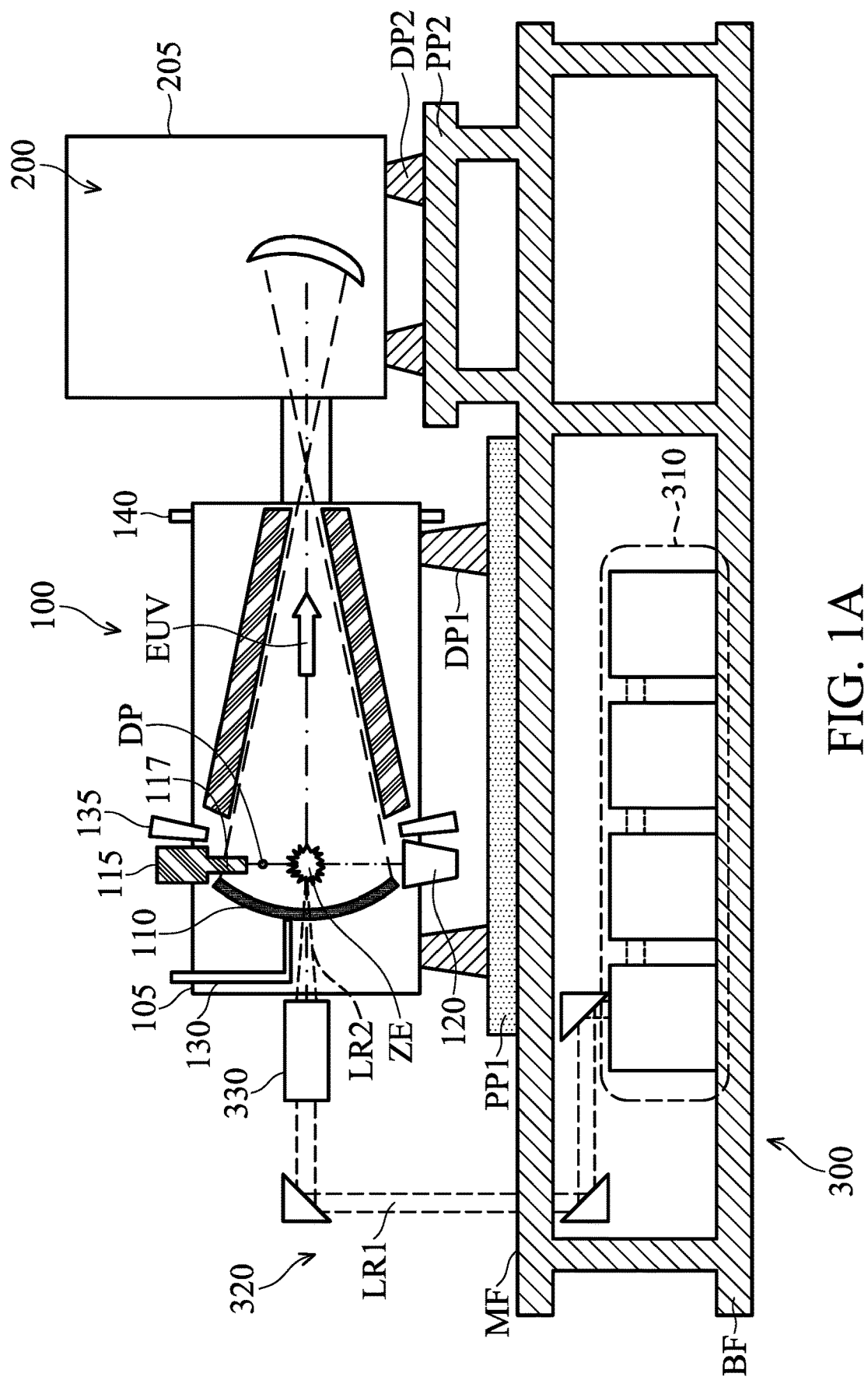
FIG. 1A is a schematic view of an EUV lithography system, in accordance with to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to extreme ultraviolet (EUV) lithography system and methods. More particularly, it is related to apparatuses and methods for cleaning a reticle holder used to secure a reticle in an EUVL exposure tool. Because gas molecules absorb EUV light, the lithography system for the EUV lithography patterning is maintained in a vacuum or a low pressure environment to avoid EUV intensity loss and prevent adverse effects of ionized gases on the wafer on which EUVL is being performed, the various layers present on the wafer, and the optical components used in the EUVL exposure tool. Therefore, an electrostatic reticle holder is used in EUVL systems to secure reticles. However, because of the force with which the reticle holder secures the reticle, contaminant particles on the reticle holder can damage the reticle holder as well as the reticle. Moreover, such contaminant particles on the reticle holder can cause minute distortions in the reticle surface, resulting in distortion in the pattern being produced on the wafer. One of the objectives of the present disclosure is directed to cleaning the reticle holder while reducing down time of the exposure tool and reducing damage to reticle holder as well as the reticle.

FIG. 1 is a schematic view of an EUV lithography system with a laser production plasma (LPP) based EUV radiation source, in accordance with some embodiments of the present disclosure. The EUV lithography system includes an EUV radiation source 100 to generate EUV radiation, an exposure tool 200, such as a scanner, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor. Each of the EUV radiation source 100 and the exposure tool 200 are placed over pedestal plates PP1 and PP2 via dampers DP1 and DP2, respectively. The EUV radiation source 100 and the exposure tool 200 are coupled to each other by a coupling mechanism, which may include a focusing unit.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength in a range from about 1 nm to about 100 nm. In one particular example, the EUV radiation source 100 generates an EUV light with a wavelength centered at about 13.5 nm.

The exposure tool 200 includes various reflective optical components, such as convex/concave/flat mirrors, a mask holding mechanism including a mask stage, and wafer holding mechanism. The exposure tool 200 further includes an exposure chamber 205 that encloses all of the optical components, mask holding mechanism and wafer holding mechanism of the exposure tool 200. The exposure chamber 205 provides a low-pressure of vacuum environment for the exposure tool 200 to avoid loss of intensity of the EUV radiation because of absorption from gases.

Figure 1B:
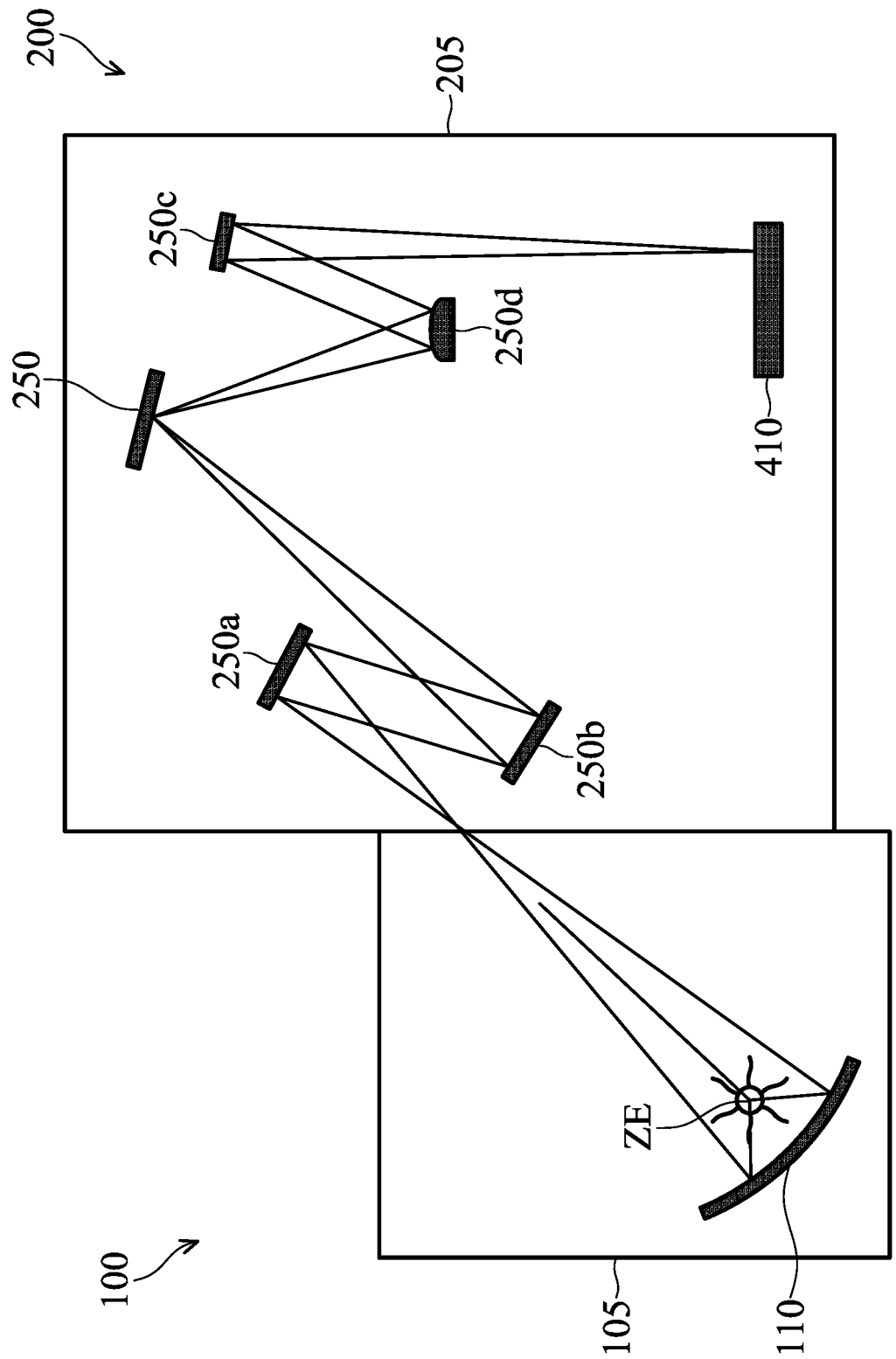
FIG. 1B is a simplified schematic diagram of a detail of an extreme ultraviolet lithography tool relating to embodiments of the present disclosure.

FIG. 1B is a simplified schematic diagram of a detail of an extreme ultraviolet lithography tool according to an embodiment of the disclosure showing the exposure of photoresist coated substrate 410 with a patterned beam of EUV light. The exposure device 200 is an integrated circuit lithography tool such as a stepper, scanner, step and scan system, direct write system, device using a contact and/or proximity mask, etc., provided with one or more optics 250a, 250b, for example, to illuminate a patterning optic 250, such as a reticle, with a beam of EUV light, to produce a patterned beam, and one or more reduction projection optics 250c, 250d, for projecting the patterned beam onto the substrate 410. A mechanical assembly (not shown) may be provided for generating a controlled relative movement between the substrate 410 and patterning optic 250. As further shown in FIG. 1B, the EUVL tool includes an EUV light source 100 including an EUV light radiator ZE emitting EUV light in a chamber 105 that is reflected by a collector 110 along a path into the exposure device 200 to irradiate the substrate 410.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is not meant to be limited to components which operate solely within one or more specific wavelength range(s), such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a low pressure environment, provided by an exposure chamber 205, to avoid EUV intensity loss.

In various embodiments of the present disclosure, the photoresist coated substrate 410 is a semiconductor wafer, such as a silicon wafer or other type of wafer to be patterned.

Figure 2A:
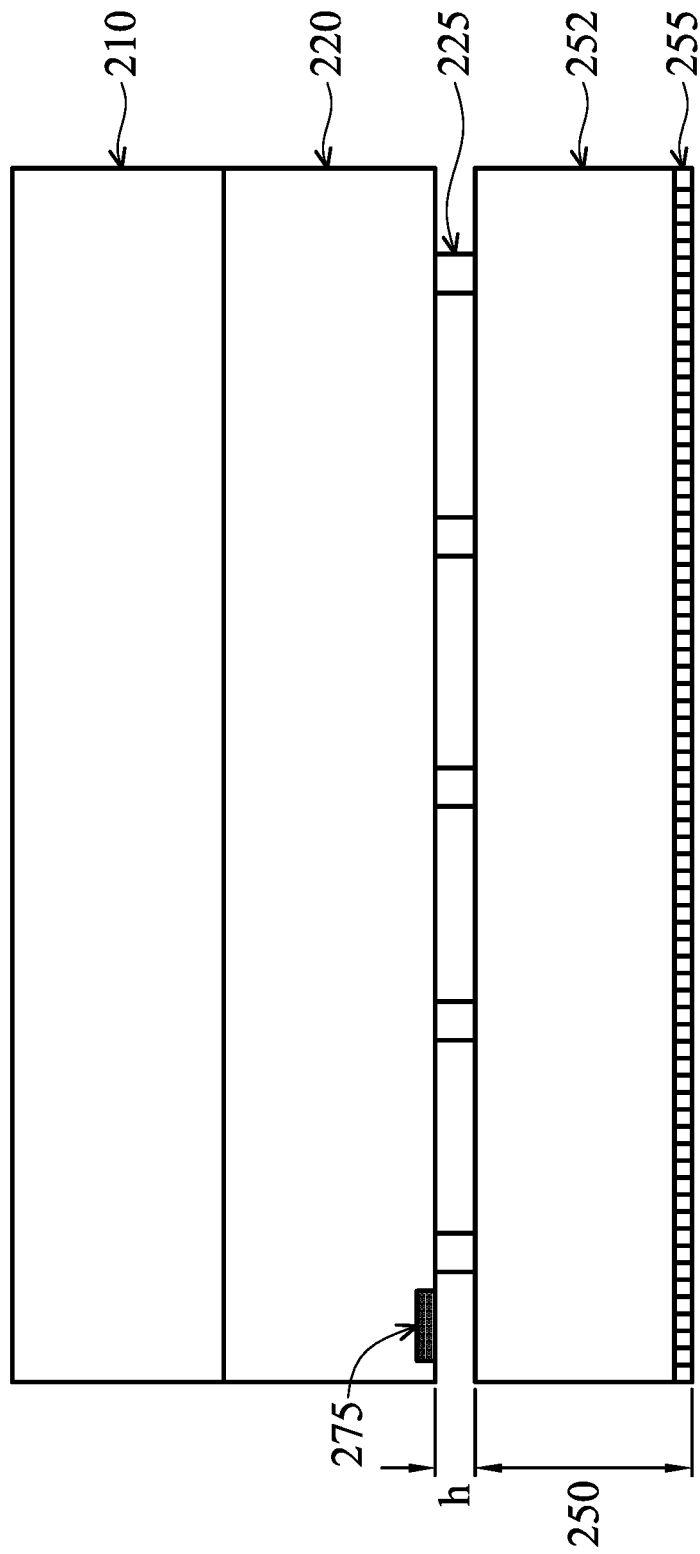
FIG. 2A schematically illustrates a mask holding mechanism relating to an embodiment of the present disclosure.

FIG. 2A schematically illustrates a mask holding mechanism in accordance with an embodiment of the present disclosure. The following description refers to FIG. 1B and FIG. 2A. The EUV radiation EUV generated by the EUV radiation source 100 is guided by the reflective optical components onto a mask 250 secured on the mask stage 210. In some embodiments, the mask stage 210 includes an electrostatic reticle holder 220 (interchangeably referred to herein as electrostatic chuck or e-chuck) to secure the mask 250.

In the present disclosure, the terms mask, photomask, and reticle are used interchangeably. In the present embodiments, the reticle 250 is a reflective mask. In an embodiment, the reticle 250 includes a substrate 252 formed of a suitable material, such as a low thermal expansion material or fused quartz. In various examples, the material includes $TiO_2$ doped $SiO_2$, or other suitable materials with low thermal expansion. The mask 250 includes multiple reflective multiple layers (ML) (not shown) deposited on the substrate 252. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 250 may further include a capping layer (not shown), such as ruthenium (Ru), disposed on the ML for protection. The mask 250 further includes an absorption layer 255, such as a tantalum boron nitride (TaBN) layer, deposited over the ML. The absorption layer 255 is patterned to define a layer of an integrated circuit (IC). Alternatively, another reflective layer may be deposited over the ML and is patterned to define a layer of an integrated circuit, thereby forming an EUV phase shift mask.

The reticle 250 and electrostatic chuck 220 of FIG. 2A are positioned such that radiation EUV supplied from the EUV radiation source 100 is in focus when it arrives at the surface of the semiconductor workpiece.

In the present embodiments, the reticle 250 is clamped by the electrostatic chuck 220 by an electrostatic potential. The reticle 250 abuts burls 225, which reside on a surface of the electrostatic chuck 220, and have a width (w) in a range from about 100 μm to about 500 μm, a space (s) in a range from about 1.0 mm to about 5.0 mm, and a height from the bottom surface of the reticle 220 in a range from about 1.0 μm to about 100 μm. Some industry-standard electrostatic chucks utilize greater than 2,000 of such burls comprising roughly 1.4% of the surface area of the electrostatic chuck 220, to support the reticle 250.

Electrostatic clamping can achieve clamp and de-clamp times of less than 1 second with an equal or greater force than conventional vacuum chucks. In addition to overlay error due to reticle 250 misalignment, clamping topography between the reticle 250 and the electrostatic chuck 220 can result in overlay error. Clamping topography can result from burl wear or contaminants 290 (see, e.g., FIGS. 3A and 3B) on a surface of the electrostatic chuck 220. For instance, burl wear is observed on one of the burls, where corners have rounded due to repeated use, which can result in non-planar clamping. Additionally, if another burl contains a flattened contaminant 290 (e.g., gold, etc.) reticle topography is further distorted. And while small contaminants 290 (e.g., with a diameter less than h) between burls may not impact reticle topography, larger contaminants 290 (e.g., with a diameter greater than h) will impact reticle topography.

In various cases, the contaminant 290 is a metal particle, a resist particle or a particle of any material generally used in semiconductor manufacturing process such as, for example, silicon dioxide, silicon nitride, etc. Depending on the type of material and size of the contaminant 290, the contaminant 290 adheres to the surface of the reticle holder 220 or the surface of the burl 225 with varying adhesive forces. For example, a resist particle might adhere to the surface of the reticle holder 220 with a greater adhesive force than a gold particle. Likewise, depending on the size and material of the contaminant 290, different forces are exerted on the reticle 250 when the reticle holder 220 clamps the reticle 250. For example, a metal particle may exert a greater force on the reticle 250 than a resist particle.

Figure 2B:
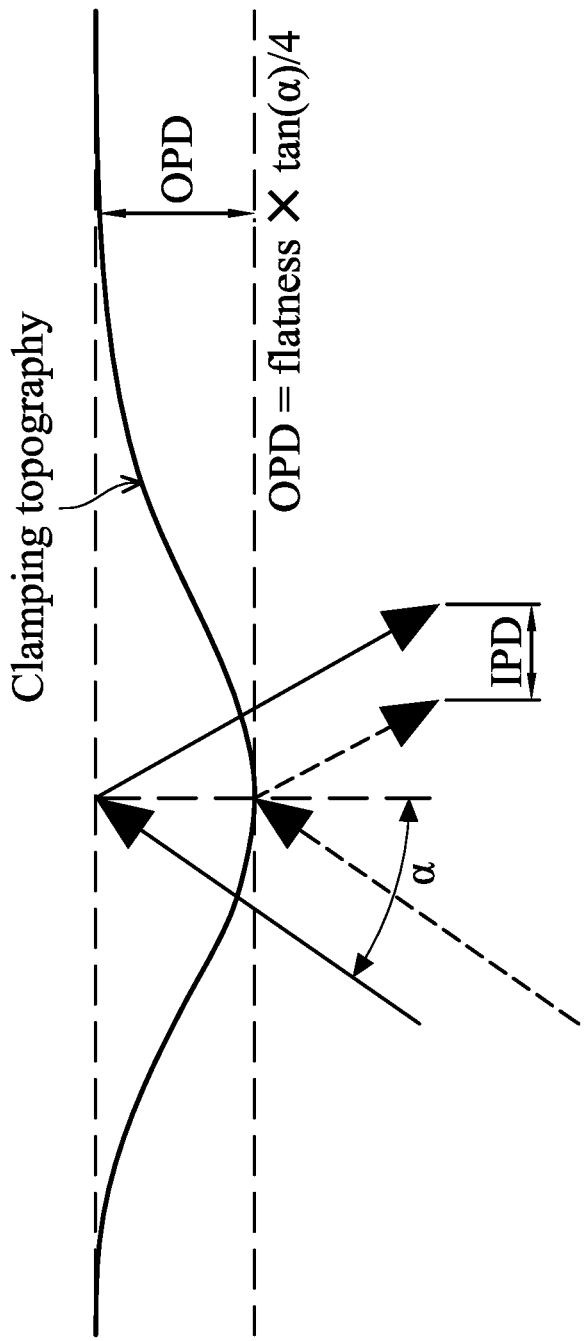
FIG. 2B illustrates clamping topography of the reticle resulting from the contaminants and other factors.

FIG. 2B illustrates clamping topography of the reticle 250 resulting from the contaminants and other factors, which causes an out of plane distortion (OPD) of the reticle surface, resulting in a lateral displacement or in plane distortion (IPD) of the radiation. For example, if a particulate contaminant 290 having a diameter larger than the burl height h is adhered to the surface of the reticle holder 220 between neighboring burls, the contaminant 290 pushes against the back surface of the reticle 250 when the reticle 250 is clamped to the reticle holder 220. Depending on material properties (e.g., elasticity, malleability, etc.) of the reticle 250 and the material properties of the contaminant 290, the distortion in the back surface of the reticle 250 may be transmitted to the front (i.e., reflecting) surface of the reticle 250. Such distortion in local topology of the reflecting surface of the reticle 250 is illustrated in FIG. 2B and is represented by the OPD. While such OPD may not significantly affect the focus of the EUV radiation at the wafer surface 410, the OPD shifts the optical path of the EUV radiation incident on the curved portion—resulting in IPD. For example, for a pattern with an absorption region laterally adjacent to a reflecting region on the reticle 250, IPD may cause EUV radiation that is supposed to be reflected to get absorbed, and EUV radiation that is supposed to get absorbed to be reflected. In other words, IPD results in loss of pattern fidelity. In other instances, IPD may additionally result in loss of overlay control for the reticle 250 and degradation in pattern uniformity such as critical dimension (CD) variation, shape biasing, etc.

Figure 3A:
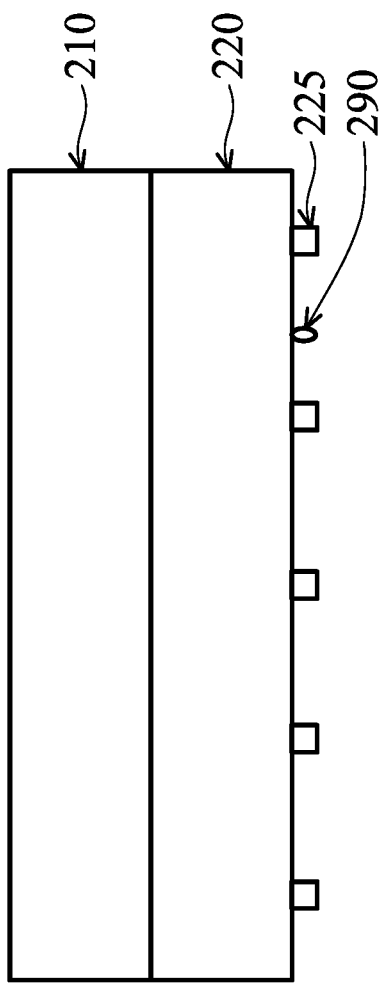
FIGS. 3A and 3B schematically illustrates removal of particulate contaminants using gas flow relating to an embodiment of the present disclosure.
Figure 3B:
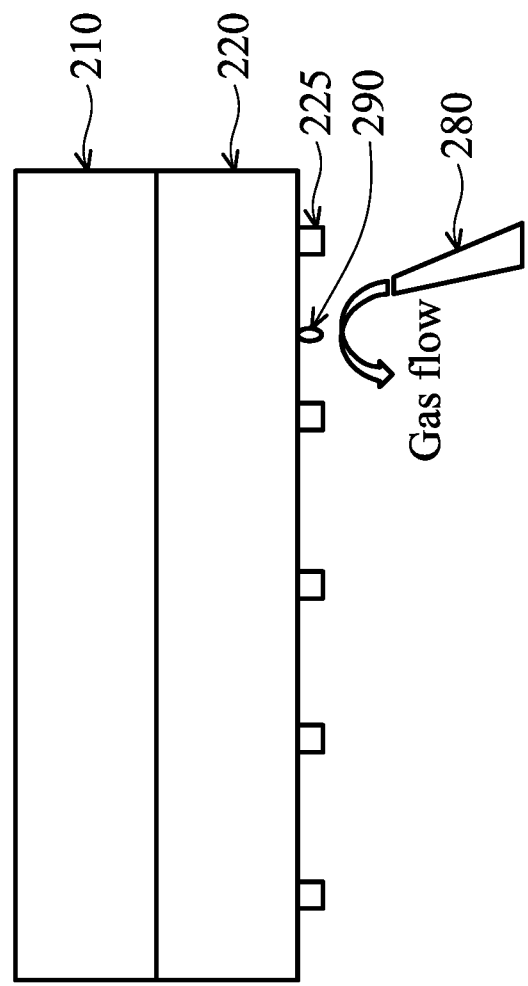

FIGS. 3A and 3B schematically illustrate removal of particulate contaminants using gas flow. In an embodiment, a particulate contaminant 290 resides on the reticle-facing surface of the electrostatic reticle holder 220. While the figure shows the contaminant 290 to be between the burls 225, the contaminant 290 could be anywhere on the surface of the reticle holder 220 including, for example, on one of the burls. When the exposure tool 200 is depressurized (e.g., before an exposure) or pressurized (e.g., for changing the reticle, or some other reason) the gas inside the exposure chamber 205 creates a turbulent flow inside the exposure chamber 205.

Eddies associated with turbulent flow create viscous drag on the contaminant particle 290 and help reduce the adhesive forces between the contaminant particle 290 and the surface of the reticle holder 250, and help dislodge the contaminant particle 290 from the surface of the reticle holder 250. The viscous drag created by a turbulent flow depends on the turbulent kinetic energy (TKE) associated with the flow. The TKE associated with a given gas-flow is characterized by root-mean-squared velocity fluctuations. Therefore, the TKE can be controlled by controlling the flow rate of gas entering or leaving the exposure chamber 205. This flow rate of gas is controlled by using a flow control valve 280. In various embodiments, the gas is air or an inert gas such as, for example, argon, neon or nitrogen. The rate of flow of the gas, in various embodiments, is in a range from about 1 standard liter per minute (slm) to about 20 slm. Depending on the size and material of the contaminant 290, the adhesive force between the contaminant 290 and the surface of the reticle holder 220 can be large enough that the drag force from increased rate of flow is insufficient to dislodge the contaminant 290 from the surface of reticle holder 225 (as is illustrated in FIG. 3B).

FIGS. 3C and 3D schematically illustrate removal of particulate contaminants using an adhesive film. As discussed elsewhere herein, in some embodiments, the increase in rate of gas flow is insufficient to dislodge a contaminant 290. In such embodiments, an adhesive film 265 is placed on a back-surface of a dummy reticle 250', the back-surface being a surface of the dummy reticle 250' that contacts the burls 225. The term dummy reticle is interchangeably used herein with the term cleaning reticle and refers to a reticle being used for cleaning the reticle holder, and is provided with an adhesive back-surface.

In various embodiments, the adhesive film 265 is a polyimide film. In some embodiments, the adhesive film 265 is a three-layer film having a first sticky layer (not shown), a second spongy layer (not shown) and a third sticky layer (not shown) in that sequence. In such embodiments, the first sticky layer contacts the back-surface of the dummy reticle 250', the second spongy layer provides a substrate for the first and third sticky layers, and the third sticky layer contacts the burls 225 and the reticle holder 220. The second spongy layer, in some embodiments, has a thickness greater than the height of the burls 225, and is sufficiently pliable that when the reticle holder 225 clamps the dummy reticle 250', the clamping force results in the burls 225 digging into the adhesive film 265 such that the third sticky layer of the adhesive film 265 contacts the portion of the reticle holder 220 between the burls 225. Such a configuration enables particles smaller than the height of the burls to also be adhered to the adhesive film 265, and may provide more surface area of the third sticky layer to come in contact with the contaminant 290, thereby increasing the adhesive forces.

The dummy reticle 250' is then unclamped from the reticle holder 220 after a period of time in a range from about 1 second to about 1 minute. If the adhesive forces between the contaminant 290 and the third sticky layer of the adhesive film 265 are greater than the adhesive forces between the contaminant 290 and the surface of reticle holder 220 (or the surface of the burls 225), the contaminant 290 is dislodged from the reticle holder 220.

On the other hand, if the adhesive forces between the contaminant 290 and the third sticky layer of the adhesive film 265 are less than the adhesive forces between the contaminant 290 and the surface of reticle holder 220 (or the surface of the burls 225), the contaminant 290 remains on the reticle holder 220. In such cases, dislodging of the contaminant 290 using the adhesive film 265 is attempted multiple times by clamping and unclamping the dummy reticle 250' from the reticle holder 220. In some embodiments, the adhesive film 265 is replaced after every attempt. In such embodiments, the dummy reticle 250' having an once-used adhesive film 265 is moved out of the vacuum environment of the exposure tool 200 using a reticle-moving robot 270, the once-used adhesive film 265 is replaced with a new adhesive film 265, and the dummy reticle 250' having the new adhesive film 265 is moved back into the vacuum environment of the exposure tool 200 to the reticle holder 220 using the reticle-moving robot 270. This process of moving the dummy reticle 250' in and out of vacuum to replace the adhesive film 265 can take several seconds to several minutes depending on how many times it is repeated to remove the contaminant 290.

Figure 4A:
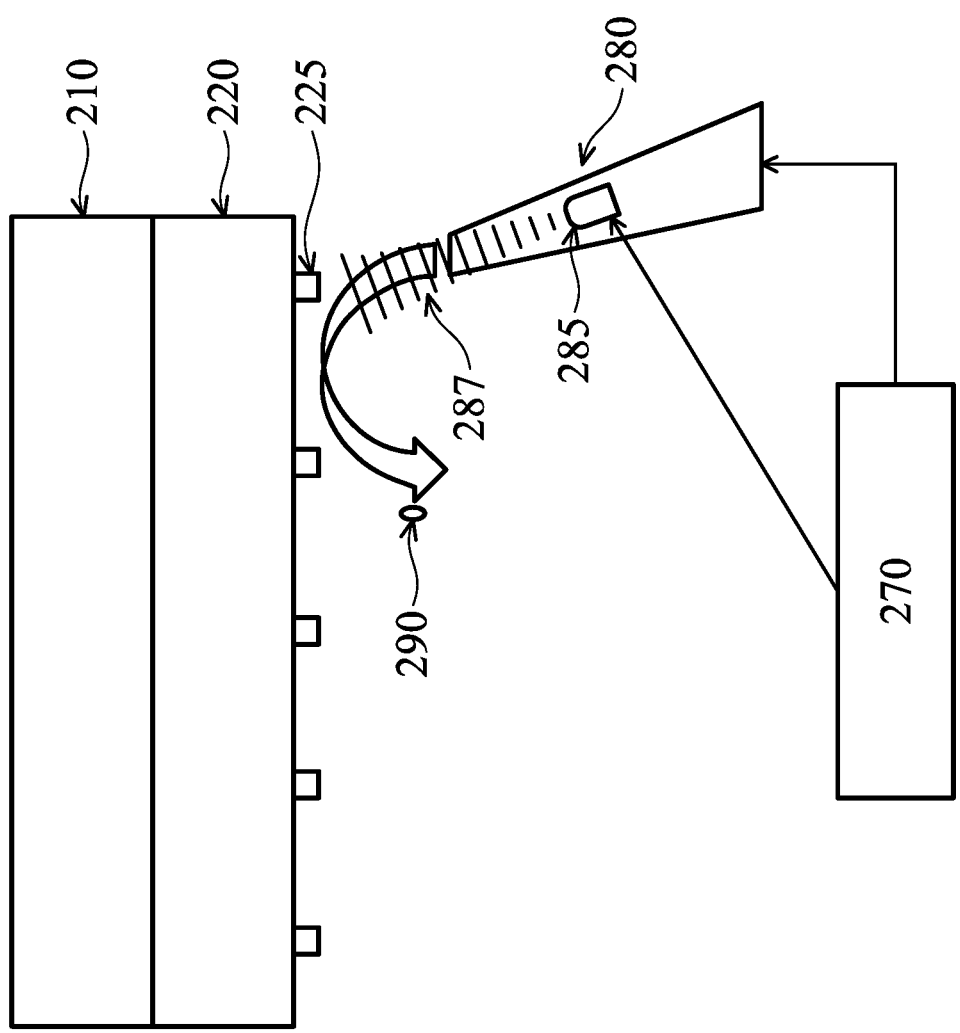
FIG. 4A schematically illustrates an apparatus for removal of a contaminant from a reticle holder using ultrasound waves in accordance with an embodiment of the present disclosure.
Figure 4B:
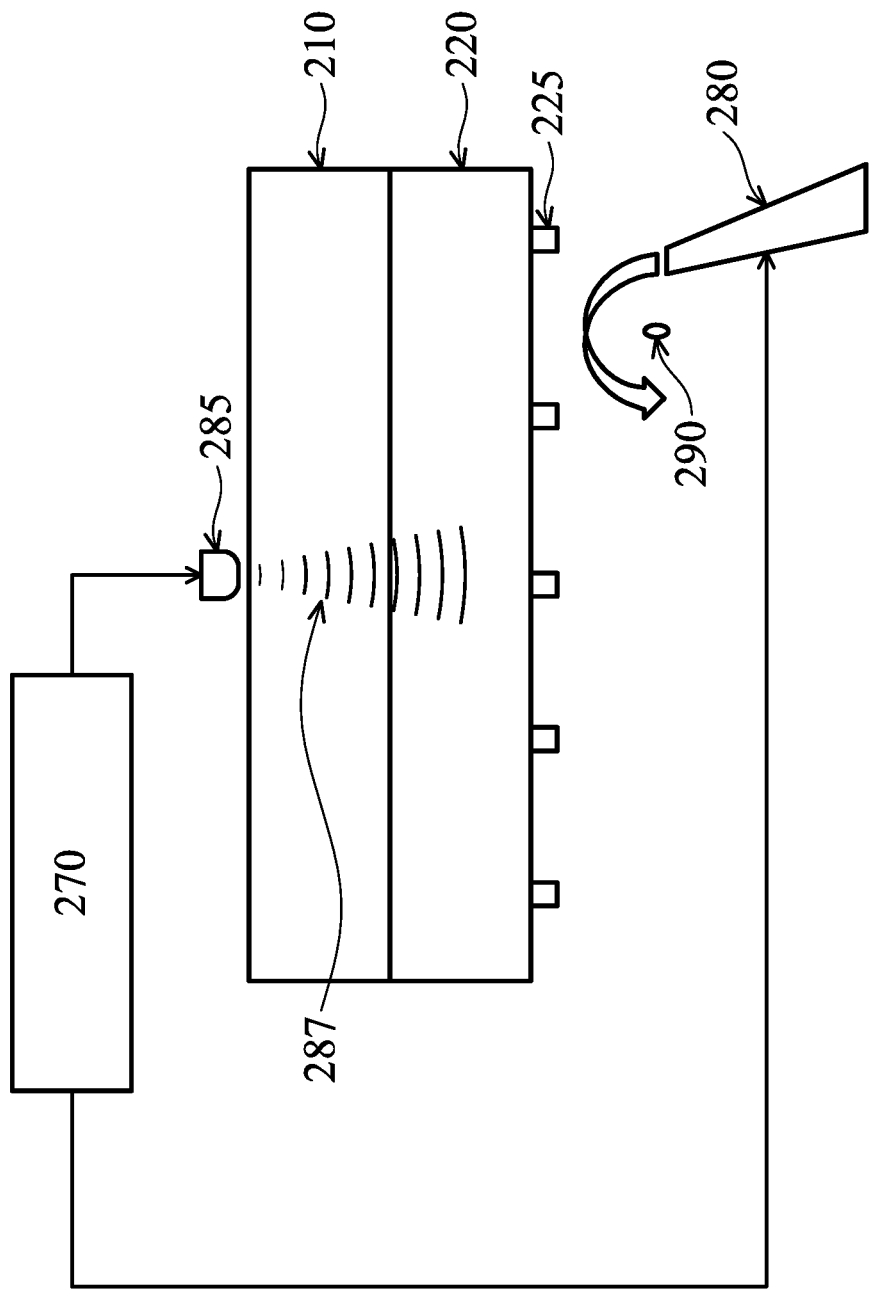
FIG. 4B schematically illustrates an alternative configuration of the ultrasound transducer in the apparatus of FIG. 4A in accordance with an embodiment of the present disclosure.
Figure 4C:
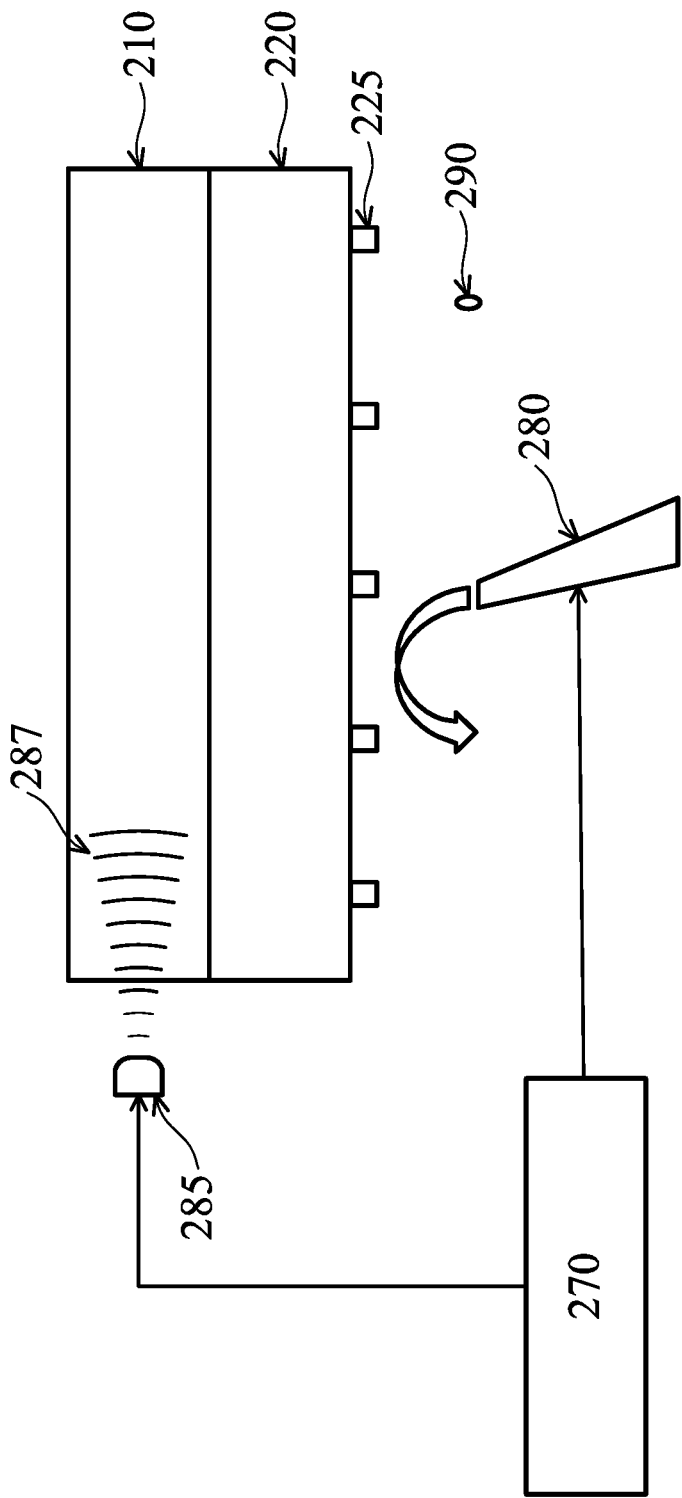
FIG. 4C schematically illustrates an alternative configuration of the ultrasound transducer in the apparatus of FIG. 4A in accordance with an embodiment of the present disclosure.

FIGS. 4A-4C schematically illustrate an apparatus for removal of a contaminant from a reticle holder using ultrasound waves. In an embodiment, an ultrasound transducer 285 is disposed in the exposure chamber 205 and configured to apply ultrasound waves 287 to the reticle holder 220. In some embodiments, the ultrasound transducer 285 is placed away from the reticle holder 220, such that the ultrasound waves 287 are incident on the surface of the reticle holder 220 that has burls 225. In such embodiments, the ultrasound waves 287 are applied while the exposure chamber 205 is being pressurized or depressurized. In other words, the ultrasound waves 287 are incident on the reticle-side surface of the reticle holder 220. The ultrasound waves 287, depending on the strength and frequency of the waves, break adhesive bonds between the contaminant 290 and the surface of the reticle holder 220, thereby dislodging the contaminant 290 from the reticle holder 220.

The ultrasound transducer 285, in various embodiments, includes a piezoelectric transducer, a capacitive transducer, or a magnetostrictive transducer. In some embodiments, the ultrasound transducer 285 is configured to produce ultrasound waves 287 of a certain fixed frequency and power. In other embodiments, the ultrasound transducer 285 is configured to produce ultrasound waves 287 of different frequencies and power, and is tunable. The ultrasound transducer 285, in some embodiments, produces a wide ultrasound beam incident on the entire reticle-facing surface of the reticle holder 220. In other embodiments, the ultrasound transducer 285 produces a focused beam incident on a small portion of the reticle-facing surface of the reticle holder 220. In such embodiments, the ultrasound beam 287 is scanned across the surface of the reticle holder 220 by either laterally moving the ultrasound transducer 285 to scan the surface of the reticle holder 220, or by changing an angle of the ultrasound transducer 285 with respect to the reticle holder 220.

In an embodiment, the ultrasound waves 287 have a frequency in a range from 20 kHz to about 5 GHz. In various embodiments, the ultrasound transducer 285 includes more than one ultrasound transducer each providing ultrasound waves 287 in a particular frequency range. For example, in an embodiment, the ultrasound transducer 285 has multiple transducers producing ultrasound waves in frequency range from about 20 kHz to about 200 kHz, about 200 kHz to about 2 MHz, about 2 MHz to about 200 MHz, about 200 MHz to about 2 GHz, or any other frequency range within the frequency range from about 20 kHz to about 5 GHz.

In some embodiments, the ultrasound transducer 285 has an ultrasound output in a range from about 1 watt per square centimeter (W/cm$^2$) to about 1 kW/cm$^2$. The ability of ultrasound waves 287 to dislodge a contaminant particle 290 is directly proportional to the power density of the ultrasound waves. However, using very high power can result in damage to the reticle holder 220 or even other components disposed in the exposure chamber 205. Moreover, higher power also requires a larger transducer, and spatial constraints within the exposure chamber 205 may not allow for a transducer larger than a particular size. Thus, the power density of the ultrasound waves 287 (or power output of the ultrasound transducer 285) is chosen, in some embodiments, to be no higher than what is necessary to dislodge the contaminant 290.

In some embodiments, the gas flow in the exposure chamber 205 is increased using the flow control valve 280 while the ultrasound waves 287 are applied to the reticle holder 220. In such embodiments, while the ultrasound waves 287 facilitate weakening of the adhesive forces between the contaminant 290 and the surface of the reticle holder 220, the increased gas flow increases the TKE within the exposure chamber 205. The increased TKE increases the drag on the contaminant 290 and further weakens the adhesive forces, ultimately dislodging the contaminant 290 from the surface of the reticle holder 220. The increased TKE also facilitates removal of the dislodged contaminant 290 from the vicinity of the reticle holder 220 so that the contaminant 290 does not reattach to the reticle holder 220.

In some embodiments, the pressure in the exposure tool 200 is temporarily decreased to facilitate complete removal of the contaminant 290 (dislodged from the surface of the reticle holder 250) from the exposure chamber 205. Those of skill in the art will appreciate that because ultrasound waves require a medium for propagation, in embodiments where the exposure chamber 205 is depressurized, the ultrasound waves 287 are not applied during depressurization to save energy. In various embodiments, the rate of gas flow in the exposure tool 200 can be increased in a range from about 1 slm to about 20 slm.

In an embodiment, an apparatus for cleaning the reticle holder 220 includes an ultrasound transducer 285 and a controller 270. The controller 270 is configured to control the gas flow controller 280 and the ultrasound transducer 285. When necessary, the controller 270 synchronizes the application of ultrasound waves 287 via the ultrasound transducer 285 with an increase in gas flow rate via gas flow controller 280 so as to increase the TKE within the exposure chamber 205. In some embodiments, the gas flow controller 280 includes a gas flow valve and a gas pump (or other similar apparatus for supplying or removing gas from the exposure chamber 205).

Those skilled in the art will appreciate that application of ultrasound waves to the reticle has the potential to damage the pattern on the reticle. Thus, in some embodiments, the apparatus further includes a reticle sensor 275. The reticle sensor 275 is configured to sense a presence of the reticle 250 and transmit a corresponding electrical signal. Examples of the reticle sensor 275 include, but are not limited to, a Hall sensor, a capacitive sensor, an optical sensor, etc. In an embodiment, the reticle sensor 275 transmits an electrical signal when the reticle 250 is contacting the burls 225 or a certain distance away from the burls 225.

The reticle sensor 275 is operably connected to the ultrasound transducer 285 such that the ultrasound transducer 285 is deactivated when the reticle sensor detects the presence of the reticle 250, in some embodiments. In other embodiments, the reticle sensor 275 is connected to the controller 270 (instead of being directly connected to the ultrasound transducer 285) which is in turn connected to the ultrasound transducer 285. In such embodiments, the controller 270 is configured to disable the ultrasound transducer 285 in response to receiving a signal from the reticle sensor 275 indicating that the reticle 250 is present at or near the reticle holder 220.

In an embodiment, the controller 270 is a circuit (or a processor) configured to receive signals from various inputs such as, for example, the reticle sensor 275, a timer circuit (not shown), etc., perform logical operations on the received signals and transmit signals to the ultrasound transducer 285 and the gas flow controller 280. The signals transmitted to the ultrasound transducer 285 include, without limitation, a timing signal, information about when to turn the transducer ON or OFF, information about frequency and power of the ultrasound waves 287 to be produced or being produced, and a direction of the ultrasound beam to be produced or being produced. The signals transmitted to the gas flow controller 280 include, but are not limited to, a timing signal, when to turn the gas flow ON or OFF, and the rate and direction of flow of gas to be set for a given operation.

In an embodiment, the controller 270 synchronizes the operation of the ultrasound transducer 285 and the operation of the gas flow controller 280. For example, the controller 270 transmits a signal to both the ultrasound transducer 285 and the gas flow controller 280 to turn ON at the same time, stay ON for a certain amount of time, and then turn OFF at the same time, in an embodiment. In embodiments where the ultrasound transducer 285 is tunable, the controller 270 transmits an additional signal specifying the frequency and power of the ultrasound waves 287 to be produced or being produced. Likewise, in various embodiments, the controller 270 is configured to transmit signals specifying various operational parameters of the gas flow controller 280 along with the ON/OFF signals.

FIG. 4B schematically illustrates an alternative configuration of the ultrasound transducer 285 in the apparatus of FIG. 4A. In an embodiment, the ultrasound transducer 285 is disposed above the mask stage 210 such that the ultrasound waves 287 generated by the ultrasound transducer 285 are conducted through the mask stage 210 to the reticle holder 220 to dislodge the contaminant 290. In such embodiments, the ultrasound waves 287 propagate transverse to the reticle-facing surface of the reticle holder 220. The ultrasound transducer 285, in some embodiments, is in contact with the mask stage 210, while in other embodiments, the ultrasound transducer is disposed in space away from the mask stage 210. In an embodiment, the ultrasound transducer 285 is embedded in or attached to the body of mask stage 210 to directly apply ultrasound vibration to mask stage 210 or reticle holder 250. In other embodiments, the ultrasound transducer 285 is embedded in or attached to the body of reticle holder 220 to directly apply ultrasound vibration to mask stage 210 or reticle holder 250.

As in the apparatus illustrated in FIG. 4A, the apparatus illustrated in FIG. 4B includes a gas flow controller 280 and a controller 270. In some embodiments, the ultrasound transducer 285 and the gas flow controller 280 are connected to the controller 270. In such embodiments, the controller 270 transmits signals controlling the operation and operational parameters of the ultrasound transducer 285 and the gas flow controller 280.

FIG. 4C schematically illustrates an alternative configuration of the ultrasound transducer 285 in the apparatus of FIG. 4A. In an embodiment, the ultrasound transducer 285 is disposed adjacent to and on a side of the mask stage 210 such that the ultrasound waves 287 generated by the ultrasound transducer 285 are conducted through the mask stage 210 to the reticle holder 220 to dislodge the contaminant 290. In such embodiments, the ultrasound waves 287 propagate parallel to the reticle-facing surface of the reticle holder 220. The ultrasound transducer 285, in some embodiments, is in contact with the mask stage 210, while in other embodiments, the ultrasound transducer is disposed in space away from the mask stage 210. In an embodiment, the ultrasound transducer 285 is embedded in or attached to the body of mask stage 210 to directly apply ultrasound vibration to mask stage 210 or reticle holder 250. In other embodiments, the ultrasound transducer 285 is embedded in or attached to the body of reticle holder 220 to directly apply ultrasound vibration to mask stage 210 or reticle holder 250. Other aspects of the apparatus remain the same, and are, therefore, not described in interest of brevity.

In some of the embodiments illustrated in FIGS. 4A-4C, the apparatus further includes a quartz crystal microbalance (QCM) (not shown) disposed on the reticle holder 220. The QCM, in such embodiments, is connected to the controller 270, and is configured to measure a variation in mass of the reticle holder 220 to monitor whether a contaminant 290 is present on the reticle holder 220. In such embodiments, an increase in mass of the reticle holder 220 detected by the QCM is a trigger for the controller 270 to activate the ultrasound transducer 285 or the gas flow controller 280 or both the ultrasound transducer 285 and the gas flow controller 280.

Figure 5:
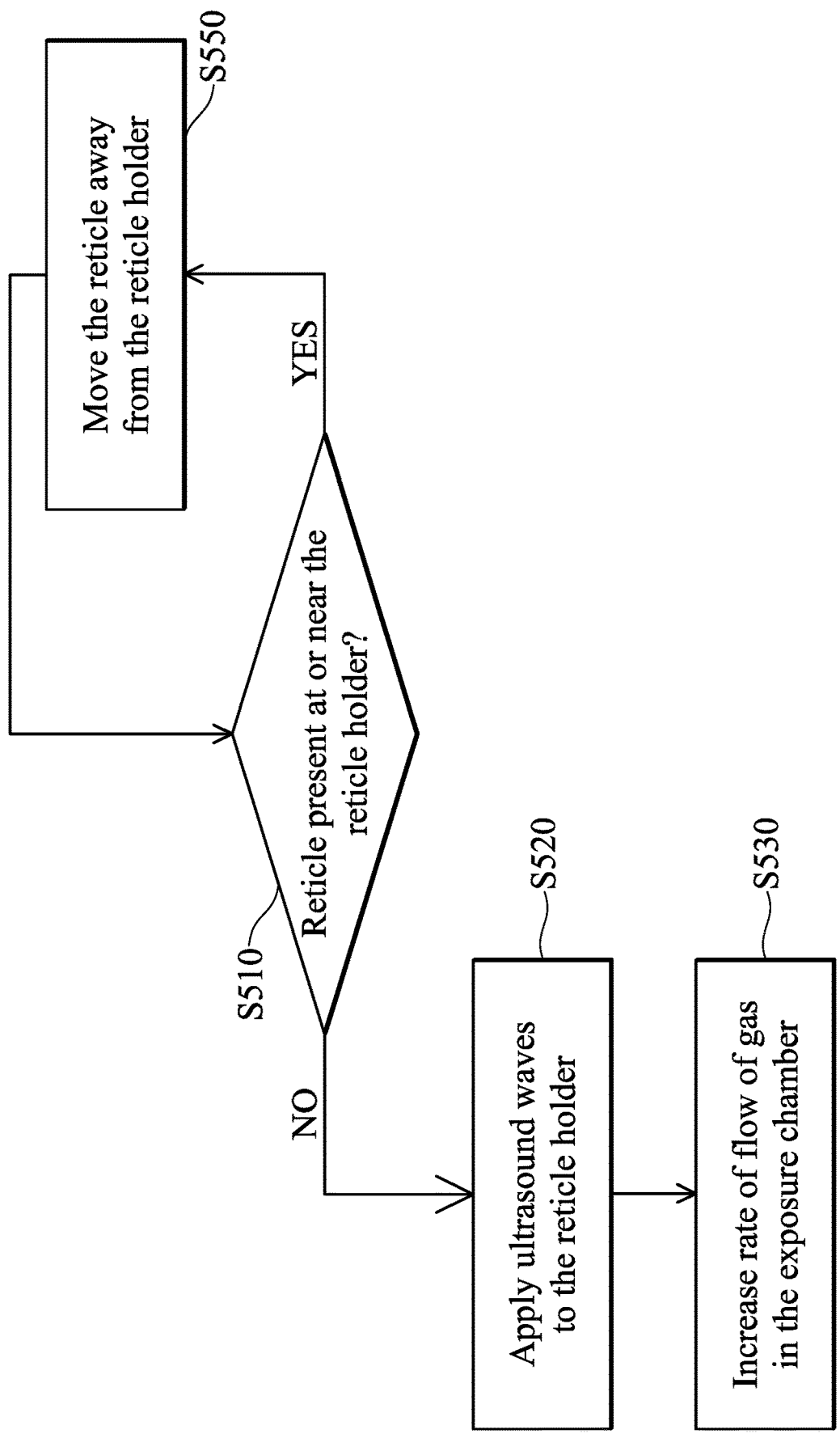
FIG. 5 illustrates a flow chart for a method of cleaning a reticle holder in accordance with an embodiment of the present disclosure.

FIG. 5 illustrates a flow chart for a method of cleaning a reticle holder. In an embodiment, the method includes, at 5510, sensing a presence of a reticle at or near the reticle holder using a reticle sensor. The reticle sensor is configured to sense a presence of the reticle and transmit a corresponding electrical signal. Examples of the reticle sensor include, but are not limited to, a Hall sensor, a capacitive sensor, an optical sensor, etc. In an embodiment, the reticle sensor transmits an electrical signal when the reticle is contacting burls of the reticle holder or a certain distance away from the burls.

If the result of the sensing is YES, at 5550, an operation to move the reticle away from the reticle holder is initiated and/or the method waits till the reticle is moved away from the reticle holder.

If the result of the sensing is NO (i.e., if a reticle is not present at or near the reticle holder), the method moves to S520 where ultrasound waves are applied to the reticle holder using an ultrasound transducer to dislodge a contaminant from a surface of the reticle holder. The ultrasound transducer, in various embodiments, includes a piezoelectric transducer, a capacitive transducer, or a magnetostrictive transducer. In some embodiments, the ultrasound transducer is configured to produce ultrasound waves of a certain fixed frequency and power. In other embodiments, the ultrasound transducer is configured to produce ultrasound waves of different frequencies and power, and is tunable. In various embodiments, the ultrasound transducer includes more than one ultrasound transducer each providing ultrasound waves in a particular frequency range. For example, in an embodiment, the ultrasound transducer has multiple transducers producing ultrasound waves in different frequency bands the frequencies of about 20 kHz to about 5 GHz. In some embodiments, the ultrasound transducer produces a wide ultrasound beam incident on the entire reticle-facing surface of the reticle holder. In other embodiments, the ultrasound transducer produces a focused beam incident on a small portion of the reticle-facing surface of the reticle holder. In such embodiments, the ultrasound beam is scanned across the surface of the reticle holder by either moving laterally moving the ultrasound transducer to scan the surface of the reticle holder, or by changing an angle of the ultrasound transducer with respect to the reticle holder depending on the placement of the ultrasound transducer with respect to the reticle holder. In some embodiments, the power density of the ultrasound waves is in a range from about 1 watt per square centimeter (W/cm$^2$) to about 1 kW/cm$^2$.

The method further moves to S530 where the rate of flow of the gas within the exposure chamber is increased to facilitate dislodging and removal of the contaminant from the surface of the reticle holder. In some embodiments, the application of ultrasound waves is synchronized with the increase in the gas flow rate.

In some embodiments, ultrasound waves are applied to the reticle holder before a reticle is clamped to the reticle holder and after the reticle is removed from the reticle holder to maintain the reticle holder in a contaminant-free state.

In the present disclosure, by applying ultrasound waves to a reticle holder, contaminant particles adhered to a surface of the reticle holder can be effectively removed in a relatively short time without the time lag and costs associated with the use of adhesive film reticles. Effective removal of contaminant particles from the surface of reticle holder helps to prolong the usable life of the reticle and to ensure fidelity of the pattern being reflected by the reticle. Applying the ultrasound waves when the reticle is not at or near the reticle holder prevents damage to the reticle.

It will be understood that not all advantages have been necessarily discussed herein, no particular advantage is required for all embodiments or examples, and other embodiments or examples may offer different advantages.

According to an aspect of the present disclosure, an apparatus for lithography includes a chamber providing a low-pressure environment. The chamber has a gas flow controller configured to enable pressurizing or depressurizing the chamber. An electrostatic chuck is disposed in the chamber. The electrostatic chuck is configured to secure a reticle. The apparatus further includes an ultrasound transducer that is disposed on a side of a mask stage and configured to apply ultrasound waves through the mask stage to the electrostatic chuck. The ultrasound waves are configured to dislodge particulate matter from the electrostatic chuck. In one or more of the foregoing and following embodiments, the apparatus further includes a controller configured to control the ultrasound transducer and the gas flow controller. In an embodiment, the controller is configured to synchronize a pressurization or a depressurization operation using the gas flow controller with an application of ultrasound waves to the electrostatic chuck using the ultrasound transducer. In some embodiments, the apparatus further includes a reticle sensor configured to sense a presence of a reticle on the electrostatic chuck. In some embodiments, the controller is further configured to initiate an application of ultrasound waves in response to a signal from the reticle sensor that the reticle is not on the electrostatic chuck. In some embodiments, the electrostatic chuck has a plurality of burls having a height in a range from 5 μm to 100 μm. In various embodiments, the particulate matter has an average diameter in a range from 10 nm to 50 μm. In some embodiments, the gas flow controller is configured pressurize or depressurize the chamber at a gas flow rate in a range from 1 standard liter per minute (slm) to 20 slm. In some embodiments, the ultrasound transducer is configured to apply ultrasound waves having frequency in a range from 20 kHz to 5 GHz. In some embodiments, the ultrasound transducer is configured to apply ultrasound waves having a power density in a range from 1 watt per square centimeter (W/cm$^2$) to 1 kW/cm$^2$.

According to another aspect of the present disclosure, a method of measuring a variation in mass of an electrostatic chuck used in a lithography system includes pressurizing or depressurizing a chamber of the lithography system. The electrostatic chuck is disposed in a space enclosed by the chamber. The method further includes applying a gas flow with turbulence kinetic energy generated by ultrasound waves to the electrostatic chuck during the pressurizing or depressurizing of the chamber. Then, a variation in mass of the reticle holder is measured using a quartz crystal microbalance disposed on the reticle holder. The ultrasound waves are configured to dislodge particulate matter from the electrostatic chuck. In one or more of the foregoing and following embodiments, the method further includes sensing a presence of a reticle on the electrostatic chuck prior to applying ultrasound waves to the electrostatic chuck. In some embodiments, the applying ultrasound waves is performed upon sensing that the reticle is not present on the electrostatic chuck. In an embodiment, the applying ultrasound waves includes applying ultrasound waves having a frequency in a range from about 20 kHz to about 5 GHz. In some embodiments, the applying ultrasound waves comprises applying ultrasound waves having a power density in a range from 1 watt per square centimeter (W/cm$^2$) to 1 kW/cm$^2$.

According to yet another aspect of the present disclosure, an apparatus for measuring a variation in mass of an electrostatic chuck used in a lithography system includes a chamber for providing a low-pressure environment for the electrostatic chuck and an ultrasound transducer configured to apply a gas flow with turbulence kinetic energy generated by ultrasound waves to the electrostatic chuck. The apparatus further includes a controller configured to control the ultrasound transducer, a gas flow controller, and a mass detector configured to measure the variation in mass of the electrostatic reticle holder. The gas flow controller is configured to enable pressurizing or depressurizing the chamber. In one or more of the following and foregoing embodiments, the controller is configured to synchronize a pressurization or a depressurization operation using the gas flow controller with an application of ultrasound waves to the electrostatic chuck using the ultrasound transducer. In an embodiment, the controller is further configured to initiate an application of ultrasound waves in response to a signal from the reticle sensor that the reticle is not on the electrostatic chuck. In some embodiments, the ultrasound transducer is configured to apply ultrasound waves having a power density in a range from 1 watt per square centimeter (W/cm$^2$) to 1 kW/cm$^2$. In some embodiments, the mass detector is a quartz crystal microbalance disposed on the reticle holder.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for lithography comprising:
   a chamber providing a low-pressure environment and having a gas flow controller configured to enable pressurizing or depressurizing the chamber;
   an electrostatic reticle holder disposed in the chamber, the electrostatic reticle holder configured to secure a reticle; and
   an ultrasound transducer disposed on a side of a mask stage configured to apply ultrasound waves through the mask stage to the electrostatic reticle holder,
   wherein the ultrasound waves are configured to dislodge particulate matter from the electrostatic reticle holder.

2. The apparatus of claim 1, further comprising a controller configured to control the ultrasound transducer and the gas flow controller.

3. The apparatus of claim 2, wherein the controller is configured to synchronize a pressurization or a depressurization operation using the gas flow controller with an application of ultrasound waves to the electrostatic reticle holder using the ultrasound transducer.

4. The apparatus of claim 1, further comprising a reticle sensor configured to sense a presence of a reticle on the electrostatic reticle holder.

5. The apparatus of claim 4, further comprising a controller configured to control the ultrasound transducer and the gas flow controller, and to initiate an application of ultrasound waves in response to a signal from the reticle sensor that the reticle is not on the electrostatic reticle holder.

6. The apparatus of claim 1, wherein the electrostatic reticle holder comprises a plurality of burls having a height in a range from 5 μm to 100 μm.

7. The apparatus of claim 1, wherein the particulate matter has an average diameter in a range from 10 nm to 50 μm.

8. The apparatus of claim 1, wherein the gas flow controller is configured pressurize or depressurize the chamber at a gas flow rate in a range from 1 standard liter per minute (slm) to 20 slm.

9. The apparatus of claim 1, wherein the ultrasound transducer is configured to apply ultrasound waves having frequency in a range from 20 kHz to 5 GHz.

10. The apparatus of claim 1, wherein the ultrasound transducer is configured to apply ultrasound waves having a power density in a range from 1 watt per square centimeter ($W/cm^2$) to 1 $kW/cm^2$.

11. A method of measuring a variation in mass of an electrostatic reticle holder used in a lithography system, the method comprising:
   pressurizing or depressurizing a chamber of the lithography system, the electrostatic reticle holder being disposed in a space enclosed by the chamber;
   applying a gas flow with turbulence kinetic energy generated by ultrasound waves to the electrostatic reticle holder during the pressurizing or depressurizing of the chamber; and
   measuring a variation in mass of the reticle holder using a quartz crystal microbalance disposed on the reticle holder,
   wherein the ultrasound waves are configured to dislodge particulate matter from the electrostatic reticle holder.

12. The method of claim 11, further comprising sensing a presence of a reticle on the electrostatic reticle holder prior to applying ultrasound waves to the electrostatic reticle holder.

13. The method of claim 12, wherein the applying ultrasound waves is performed upon sensing that the reticle is not present on the electrostatic reticle holder.

14. The method of claim 12, wherein the applying ultrasound waves comprises applying ultrasound waves having frequency in a range from 20 kHz to 5 GHz.

15. The method of claim 12, wherein the applying ultrasound waves comprises applying ultrasound waves having a power density in a range from 1 watt per square centimeter ($W/cm^2$) to 1 $kW/cm^2$.

16. An apparatus for measuring a variation in mass of an electrostatic reticle holder used in a lithography system, the apparatus comprising:
   a chamber for providing a low pressure environment for the electrostatic reticle holder;
   an ultrasound transducer configured to apply a gas flow with turbulence kinetic energy generated by ultrasound waves to the electrostatic reticle holder;
   a controller configured to control the ultrasound transducer;
   a gas flow controller; and
   a mass detector configured to measure the variation in mass of the electrostatic reticle holder,
   wherein the gas flow controller is configured to enable pressurizing or depressurizing the chamber.

17. The apparatus of claim 16, wherein the controller is configured to synchronize a pressurization or a depressurization operation using the gas flow controller with an application of ultrasound waves to the electrostatic reticle holder using the ultrasound transducer.

18. The apparatus of claim 16, wherein the controller is further configured to initiate an application of ultrasound waves in response to a signal from a reticle sensor that the reticle is not on the electrostatic reticle holder.

19. The apparatus of claim 16, wherein the ultrasound transducer is configured to apply ultrasound waves having a power density in a range from 1 watt per square centimeter ($W/cm^2$) to 1 $kW/cm^2$.

20. The apparatus of claim 16, wherein mass detector is a quartz crystal microbalance disposed on the reticle holder.

* * * * *